US006566653B1

(12) United States Patent
Gerber et al.

(10) Patent No.: US 6,566,653 B1
(45) Date of Patent: May 20, 2003

(54) INVESTIGATION DEVICE AND METHOD

(75) Inventors: Christoph Gerber, Richterswil (CH); Michel Despont, Adliswil (CH); Peter Vettiger, Langnau am Albis (CH); Ernst Meyer, Muttenz (CH); Roland Bennewitz, Basel (CH)

(73) Assignee: International Business Machines Corporation, Armonk, NY (US)

( * ) Notice: Subject to any disclaimer, the term of this patent is extended or adjusted under 35 U.S.C. 154(b) by 23 days.

(21) Appl. No.: 09/683,592

(22) Filed: Jan. 23, 2002

(51) Int. Cl.[7] .................................................. H01J 37/30

(52) U.S. Cl. ....................... 250/288; 250/306; 250/307; 250/423 F; 250/692.3; 73/105; 73/104; 356/372

(58) Field of Search ................................. 250/288, 306, 250/307, 287, 423 F, 492.3; 73/105, 104; 356/372

(56) References Cited

U.S. PATENT DOCUMENTS 5,621,211 A * 4/1997 Spence ....................... 250/306
5,742,377 A * 4/1998 Minne et al. ................. 355/71

FOREIGN PATENT DOCUMENTS

JP 6-195155 7/1994 ............. G06F/1/20

OTHER PUBLICATIONS

Weierstall, U., and Spence, J.C.H., "Atomic Species Identification.", Surface Science 398 (1998) 267–279.*

J.C.H. Spence and U. Weierstall. *Department of Physics and Astronomy, Arizona State University, Tempe, Arizona:* W. Lo. *Department of Applied and Engineering Physics, Cornell University, Ithica, New York*; "Atomic Species Identification In Scanning Tunneling Microscopy By Time–Of––Flight Spectroscopy"; J. Vac. Sci. Techno. B 14(3). May/Jun. 1996 American Vacuum Society pp. 1587–1590.

* cited by examiner

*Primary Examiner*—John R. Lee
*Assistant Examiner*—Zia R. Hashmi
(74) *Attorney, Agent, or Firm*—Derek S. Jennings

(57) ABSTRACT

An investigation device includes a time of flight mass spectrometer with an entrance opening, and an electrically conductive tip on a cantilever which is movable from a first position near a sample on a sample holder to a second position near the entrance opening. A sample particle is obtained with the tip being in the first position from the sample. The tip, with the particle, is moved into the second position where the particle can be accelerated towards the entrance opening. The particle is analyzable by the time of flight mass spectrometer.

10 Claims, 2 Drawing Sheets

INVESTIGATION DEVICE AND METHOD

BACKGROUND OF INVENTION

1. Field of the Invention

The invention relates to an investigation device and an investigation method. More particularly, it relates to a device for picking of particles from a sample and analyzing them with a mass-spectrometer.

2. Background of the Invention

Japanese disclosure, JP 061 95155, discloses a region surface analyzing method and device. A surface atom of a specimen is stuck to the tip of a probe. A specimen holder is removed from a scanning tunneling microscope and placed outside the time of flight of an ion. When a switch is switched, output voltages of a straight polarity from a high voltage power source and a straight polarity from a pulse generator are adjusted to generate a pulse. The pulse generated is picked up by a logos key coil and a clock of a mass spectrometry system using a time of flight method is started. When the ion is separated, the clock is stopped by a signal sent from an ion detector and the time difference between the stop signal and the start signal, the time of flight, is recorded. An element is identified based on the time of flight.

In an article entitled, "Atomic species identification in scanning tunneling microscopy by time of flight spectroscopy" by Spence, Weierstall, and Lo, Journal of Vacuum Science Technology, B 14(3), May/June 1996, pp. 1587–1590, it is described how atoms at particular sites can be selected from an STM or AFM image for identification. Atoms from a sample are picked up with a tip, the sample is the being removed and a much larger voltage pulse is applied causing field evaporation of these atoms into a time of flight mass spectrometer.

SUMMARY OF INVENTION

The invention is directed to an investigation device comprising a time of flight mass spectrometer with an entrance opening, and an electrically conductive tip which is movable from a first position near a sample on a sample holder to in a second position near the entrance opening. The tip is located at a cantilever. In the case where a sample is located on the sample holder, a sample particle can be obtained when the tip is in the first position located next to the sample. The tip, having obtained the particle, is movable into the second position where the particle can be accelerated towards the entrance opening. The particle is then analyzable in the time of flight mass spectrometer.

Various other objects, features, and attendant advantages of the present invention will become more fully appreciated as the same becomes better understood when considered in conjunction with the accompanying drawings, in which like reference characters designate the same or similar parts throughout the several views.

DETAILED DESCRIPTION

Figure 1:
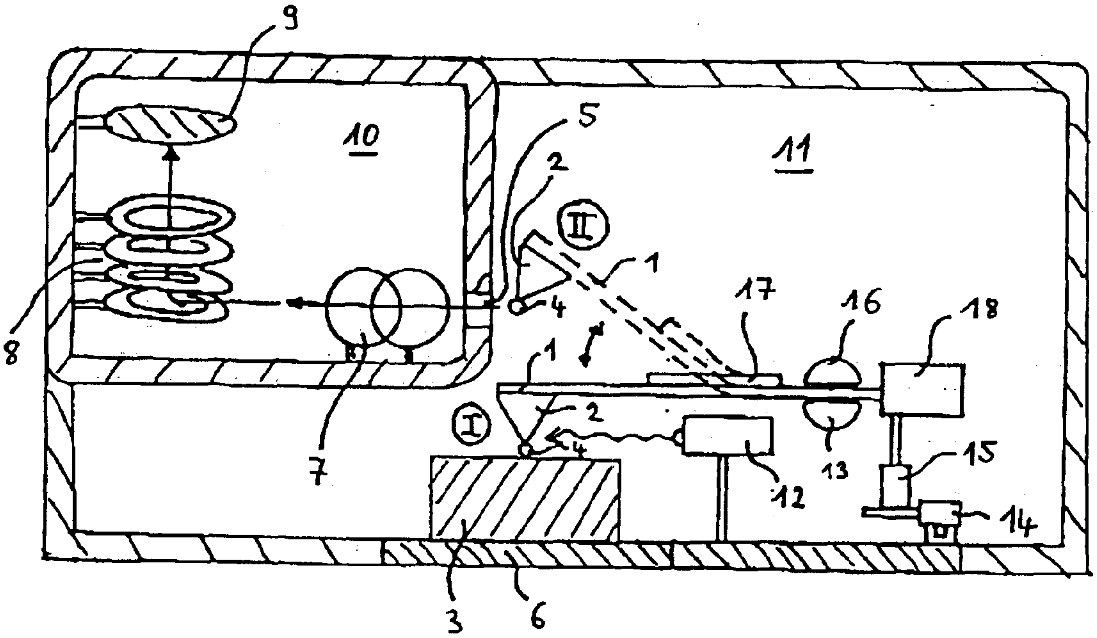
FIG. 1 shows an investigation device with a time of flight mass spectrometer.

According to a first aspect of the invention as set forth in the claims, the investigation device has the advantage that the time between the pickup of a particle and its mass spectroscopy reading is reduced. This is particularly advantageous in the case of a series of such particles being analyzed. Therefor the tip can be designed to be movable between a second position and a first position. Hence a series of sample particles can be investigated in a row, which allows for the creating of a topographical image of the sample with respect to the sample particle distribution on its surface in accordance with the analysis results obtained from these sample particles.

Using a cantilever to hold the tip is advantageous because the experience and the technology in the field of cantilever based microscopy can be exploited and utilized in combination with this investigation device. The cantilever in an advantageous manner allows moving the tip up and down by bending, combining the high sensitivity of cantilever-based atomic-force investigation techniques with the possibility to move the tip in a larger scale than for atomic-force microscopy in order to transport the picked sample particle to the entrance opening of the mass spectrometer. The investigation device thereby allows for combination of atomic-force-based imaging and sample particle analysis.

The frequency of repetitive particle detection can be in the range of 1 particle per 30 ms. The distance between the first and second position can be in the range of 10 to 100 micrometers. This small distance allows very precise positioning of the tip in the first as well as in the second position. Furthermore, this distance can be traveled at faster speeds with very precise short-range positioners. No wide-range drives are necessary.

A further advantage of having a small distance between the first and second positions and the possible use of high-precision small-range drive is that after having picked up a sample particle and delivered it for mass spectroscopy analysis, the tip is movable back to exactly the same position where the particle was picked up. This exact repositioning allows the analysis of several particles in a row that are positioned very close on the sample. This combines with the advantage of only having small movements of the tip that such a series can be analyzed in a very short time without introducing imprecision of positioning.

The cantilever can be designed to be bendable in order to move the tip between the second position and the first position. Furthermore, an actuator can be arranged for bending the cantilever, the actuator preferably serving to apply one or more piezo, bimetallic, capacitive, electrostatic, magnetic, thermal force. Bending a cantilever is a technique well known from atomic force microscopy and hence already well investigated with respect to the physical characteristics, signal detection and processing etc. The know-how on that field can therefore be advantageously utilized.

A further advantage is achievable when the entrance opening of the mass spectrometer is designed to comprise an electrode that serves for creating an electrical field for the acceleration of the particle from the tip towards the mass spectrometer. Since that electrode, by being near the entrance opening, is closer to the tip than with known arrangements, the attraction of undesired particles is reduced and the analysis result is improved.

In case the electrode comprises a grid-like structure, preferably manufactured by a lithographic process, the electric field generated shows a better homogeneity than non-grid electrodes. The homogeneity allows precise voltage control and precise measurement results since the acceleration is also homogeneously distributed over the space in front of the electrode. The electric field is stronger when the electrode is located closer to the second position than to the first position. This leads to a reduced acceleration of undesired particles in the direction of the entrance opening and therefore improves measurement result. This is of particular advantage in case the sample has edges, which are preferred sources of undesired particles.

An oscillator can be arranged for exciting the cantilever to oscillate at a predetermined frequency. The excitation can be used to drive the cantilever in a resonant mode and detect shifts in the resonance frequency due to the surface structure of the sample.

The investigation device can also have a voltage generator or an irradiator for assisting then picking up of the sample particle. Thereby the picking up of the sample particle can on the one hand be facilitated which provides useful for sample particles that exhibit a higher sticking force towards the sample than towards the tip. On the other hand, the picking up can be accelerated which contributes to the general analysis speed. Quick analysis is particularly useful for performing a series or a multitude of such analysis and in particular, for samples that might exhibit a time-dependent characteristic, e.g. biological samples, which might be prone to decay.

It also provides useful to have a frequency-measuring device for measuring a frequency at which the cantilever oscillates. Such measurement is a useful feedback to detect surface irregularities and generally to investigate sample influence on the oscillation of the cantilever.

The investigation device can have a x/y-drive for moving the tips across the sample and/or a z-drive for moving the tip up and down relative to the sample provide useful to position the tip at a desired coordinate on the sample for investigating the sample at exactly that point.

The investigation device can be arranged in an evacuatable chamber to avoid the influence of external parameters, such as particles resident in the environment.

In the following, the various exemplary embodiments of the invention are described.

In FIG. 1, shown is a schematic view of an investigation device. The investigation device comprises a sample holder 6 whereupon a sample 3 is situated. Furthermore, a cantilever 1 is fixed at one end at a cantilever holder 18 that is movable by means of a z-drive 15 and an x/y-drive 14 relative to the sample 3. At its free end, the cantilever 1 carries a tip 2. The cantilever 1 furthermore carries an actuator 17, an oscillator 13 and a frequency-measuring device 16. The cantilever 1 with the tip 2 is positionable in a first position I near the sample 3 and in a second position II near an entrance opening 5 of a mass spectrometer 10. The mass spectrometer 10 comprises a first accelerator 7, a second accelerator 8 and an ion detector plate 9. The described arrangement is arranged in a chamber 11 that is evacuatable.

In operation, the tip 2 is used in the first position I to pick up a sample particle 4 from the sample 3 and then the tip 2 is moved by means of the actuator 17 to the second position II. Then the sample particle 4 is removed from the tip 2 by means of acceleration towards the mass spectrometer 10.

The sample particle 4 thereby moves from the tip 2 through the entrance opening 5 into the mass spectrometer 10, through the two accelerators 7, 8 and arrives at the ion detector plate 9. The flight time of the sample particle 4 is detected by measuring the time between the moment when the sample particle 4 leaves the tip 2 and the moment the same sample particle 4 arrives at the ion detector plate 9.

The tip 2 can be moved back into the first position I where again another sample particle 4 can be picked up and treated in the same way, the first sample particle 4 has been treated. Thereby the investigation device allows serialized investigation of the sample 3 by mass-spectrometric analysis of the sample particles 4. The use of the cantilever 1 together with the actuator 17 allows a precise control between the positions I, II and hence a topographical analysis of the sample 3. The tip 2 will arrive with a sufficient accuracy at the first position I such that the relative position of the first sample particle 4 and the next sample particle 4 is known and hence the analysis of the sample particles 4 reveals knowledge about the distribution of the analysis results with respect to the sample surface. The x/y-drive 14 serves for moving the tip 2 across the sample 3 and the z-drive 15 serves for moving the tip 2 up and down relative to the sample 3. Under use of the drives, in particular the x/y-drive 14, a scanning movement of the tip 2 across the sample 3 can be achieved, allowing a serial investigation of the sample surface, picking sample particles 4 from different places on that surface and analyzing them in the mass spectrometer 10.

The distance between the two positions will advantageously be selected to be in a dimension of approximately 100 to 500 micrometers. This allows on one hand to maintain short times between the handling of several such sample particles 4 and on the other hand contributes to the accuracy of the repositioning of the cantilever 1 and the tip 2 in the first position I. The sample 3 has not to be removed from its original position in order to allow for the time of flight analysis. This again contributes to low analysis time and facilitates the repositioning of the tip 2 with high precision.

The investigation device can be operated in a constant frequency-shift mode, where the resonance frequency of the cantilever 1 is measured and kept constant during x/y-scanning. This method allows for true atomic resolution of insulators, semiconductors and metals as the given sample 3. After imaging a particular surface area, the tip 2 can approach towards the surface of the sample 3 by increasing the frequency shift. As the sample particle 4, clusters, individual atoms or molecules can be picked up by the tip 2. This transfer from the sample 3 to the tip 2 can be enhanced with additional procedures, such as voltage pulses or laser irradiation, e.g. from an irradiator 12. After this transfer of the sample particle 4, the tip 2 is directed towards the entrance opening 5 of the time of flight mass-spectrometer 10.

Figure 2:
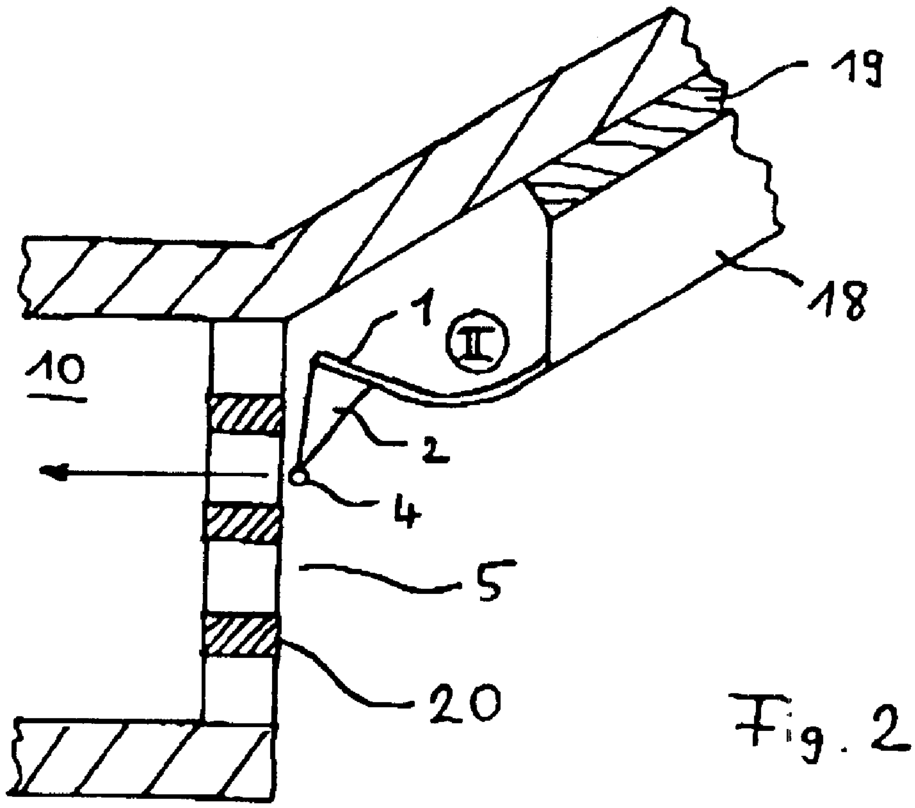
FIG. 2 shows a detailed view of a tip located in front of the entrance opening of the mass spectrometer.

In FIG. 2 a detailed view of a preferred embodiment of the entrance opening 5 and the arrangement of the cantilever 1 is depicted. The entrance opening 5 is designed to have a grid-like electrode 20. That electrode 20 is integrated into the entrance opening 5 and is arranged face the second position II of the tip 2. The cantilever holder 18 is attached to the housing of the mass spectrometer 10, separated therefrom by an isolator 19. The cantilever 1 is bent such that when the tip 2 it is in the second position II the sample particle 4 at the apex of the tip 2 is located in proximity to the electrode 20. In this example the movement between the two positions I, II is achievable by the bending of the cantilever 1. The bending can be here achieved through a capacitive like feature, i.e. electrostatic force between the cantilever 1 and the housing of the mass spectrometer 10.

The acceleration used to accelerate the sample particle 4 is generated by applying an electric voltage pulse between the tip 2 and the electrode 20. Due to the vicinity of the electrode 20 to the tip 2, the voltage for generating the electric field that suffices to accelerate the sample particle 4 to leave the tip 2 in direction of the entrance opening 5, can be lower than a voltage would have to be applied between the tip 2 and the first accelerator 7 to achieve the same result. The constructional combination of the entrance opening 5 with the electrode 20 hence leads to a voltage reduction. Due to the lower voltage, the electric field that reaches the sample 3 is lower and hence the amount of particles that are generally attracted therefrom by the electric field is lower. Since any particle that besides the sample particle 4 that is to be investigated, enters the entrance opening 5 is a disturbing factor and could negatively influence the result of the analysis, it is of advantage to reduce the amount of such undesired particles. In the case of the sample holder 3 having edges and corners, those areas would be particularly prone to emission of undesired particles. The preferred embodiment hence has the electrode 20 integrated into the entrance opening 5. A preferred method of manufacturing the electrode 20 is microfabrication, i.e. the use of lithographical steps, i.e. deposition of materials and/or resist, patterning with masks and illumination, etching and cleaning, to define and produce the structure of the electrode 20. Thereby openings in the electrode 20 of the size of 10 to 50 micrometers in diameter can be produced.

When a voltage is applied, an electric field of the electrode 20 extends only to the area of the second position II. The second position II is selected to be in front of the entrance opening 5. The second position II is closer to the entrance opening 5 than to the sample 3. This means that the electrical field density is higher in the second position II than in the first position I.

A voltage pulse is applied to the tip 2, e.g. in the range of 5 to 20 kV. Due to the increased in the electrical field at the position of high curvature, the apex of the tip 2 is the region for field concentration and hence automatically the position where the sample particle 4 is induced to be removed from the tip 2 in response to the electric field. This allows for the transfer of the sample particle 4 to the entrance opening 5 of the mass-spectrometer 10. The first and second accelerator 7, 8 serve for creating additional acceleration of the sample, which can be used to achieve more detailed results of the analysis. However, each of these accelerators 7, 8 can be optional.

The time of flight can be selected as the time between the voltage pulse and the moment in which the sample particle 4 arrives at the ion detector plate 9.

The ionization procedure can be combined with the heating of the tip 2 and/or laser irradiation. Finally, the accelerated sample particle 4 is analyzed by the time of flight mass spectrometer 10, which gives e.g. element-specific information about the mass/charge ratio of the sample particle 4. The process can be serialized by performing the described method for one sample particle 4, then moving the tip 2 relatively to the sample 3 and picking up another sample particle 4 and performing the method with that sample particle 4.

The oscillator 13 can be used for exciting the cantilever 1 to oscillate at a predetermined frequency. The frequency-measuring device 16 can be used for measuring the frequency at which the cantilever 1 oscillates. By these two elements 13, 16 the resonance of the cantilever 1 can be utilized for the investigation. Since the oscillation frequency of the cantilever 1 depends on its resonance frequency, which again depends on geometrical and mass-related conditions of the cantilever 1, additional information can be derived from a frequency shift of the oscillation frequency of the cantilever 1 that is measurable with the frequency-measuring device 16.

The cantilever may comprise a silicon material and can be advantageously manufactured using a lithographic process. The same applies to the tip 2 which can even be manufactured in one piece together with the cantilever 1. For making the tip electrically conductive, it can be doped, and/or also coated with an electrically conductive material like aluminum.

The cantilever holder 18 can also be comprised of silicon material, and it could advantageously be manufactured in one piece together with the cantilever 1, e.g. be a remainder of a silicon wafer from which the cantilever 1 and the tip 2 have been etched free. Having the cantilever 1 in an electrically conductive form allows exerting an electrostatic force upon it to effect the bending. The generator for the electrical field used for that bending could be used at the same time for accelerating the sample particle 4, with the difference that the voltage for that acceleration is rather a pulse whereas the bending-generating voltage remains static for the bending time.

The described embodiment allows a dimensioning that itself allows a high repetition rate of the performed analysis. The entrance opening 5 can be arranged in close proximity to the tip 2 when that tip 2 is in the second position II, that means that the distance between the tip 2 and the entrance opening 5, respectively the electrode 20 is in the range of the length of the tip 2, the length being the distance of the apex to the base of the tip 2 at which it is fixed to the cantilever 1. The distance between the first position I and the second position 11 can be larger than the tip length, preferably in the dimension of between one time to 3 times the length of the cantilever 1. The entrance opening 5 is advantageously small to avoid the influence of undesired particles. A preferable size would be a diameter equal to the cantilever length. The cantilever 1 may typically have a length of 200 micrometers.

The described arrangement can be altered in that not only one, but several cantilevers 1 with tip 2 being arranged, e.g. in form of an array, and can be driven in parallel, thereby increasing the possible frequency of the analysis. The herein described embodiment can also be altered in that it is combined with a standard AFM functionality, i.e. a cantilever with a tip that performs the known AFM analysis in addition to the described topographical time of flight analysis.

Any disclosed embodiment may be combined with one or several of the other embodiments shown and/or described. This is also possible for one or more features of the embodiments.

It is obvious that a person skilled in the art can modify the shown arrangements in many ways without departing from the gist of the invention, which is encompassed by the subsequent claims.

What is claimed is:

1. An investigation device comprising:

a time of flight mass spectrometer with an entrance opening, a cantilever with an electrically conductive tip that is movable from a first position near a sample on a sample holder to a second position near said entrance opening, wherein in the case of said sample being located on said sample holder, the dimension of said tip and of said first position relative to said sample is such that in said first position said sample particle is pickable with said tip from said sample, and the dimension of said tip and of said second position relative to said entrance opening is such that in said second position said sample particle is acceleratable towards said entrance opening, furthermore, said time of flight mass spectrometer serves for analyzing said sample particle.

2. An investigation device according to claim 1, characterized in that the tip is movable back from said second position into said first position.

3. An investigation device according to claim 1, characterized in that the cantilever is bendable in order to move said tip between said second position and said first position.

4. An investigation device according to claim 3, further comprising an actuator for bending said cantilever, said actuator preferably serving to apply one or more of a piezo, bimetallic, capacitive, electrostatic, magnetic, thermal force.

5. An investigation device according to claim 1, wherein the entrance opening comprises an electrode for generating an electric field for accelerating the sample particle towards the entrance opening.

6. An investigation device according to claim 5, wherein the electrode comprises a grid-like structure, preferably manufactured by a lithographic process.

7. An investigation device according to claim 5, wherein the electrode is located closer to the second position than to the first position.

8. An investigation method comprising steps of:

positioning an electrically conductive tip that is attached to a cantilever at a first position near a sample;

picking up with said tip a sample particle from said sample;

moving said tip with said sample particle from said first position into a second position near an entrance opening of a time of flight mass spectrometer;

accelerating said sample particle towards said entrance opening; and analyzing said sample particle in said time of flight mass spectrometer.

9. An investigation method according to claim 8, further comprising the step of moving the tip back from said second position into said first position.

10. An investigation method according to claim 9, wherein said step of moving the tip is performed by bending the cantilever, preferably by one or more of a piezo, bimetallic, capacitive, electrostatic, magnetic, thermal force.

* * * * *